(12) United States Patent
Aliyev

(10) Patent No.: US 8,394,654 B2
(45) Date of Patent: Mar. 12, 2013

(54) METHOD FOR COATING PHOSPHOR, APPARATUS TO PERFORM THE METHOD, AND LIGHT EMITTING DIODE COMPRISING PHOSPHOR COATING LAYER

(75) Inventor: Yevgeni Aliyev, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 531 days.

(21) Appl. No.: 12/411,978

(22) Filed: Mar. 26, 2009

(65) Prior Publication Data

US 2009/0242921 A1 Oct. 1, 2009

(30) Foreign Application Priority Data

Mar. 26, 2008 (KR) .................. 10-2008-0027731

(51) Int. Cl.
*H01L 21/00* (2006.01)
*C25D 15/00* (2006.01)
(52) U.S. Cl. .................. 438/29; 204/600; 257/E21.001
(58) Field of Classification Search .................. 257/79, 257/98; 438/22, 29; 204/600–650
See application file for complete search history.

(56) References Cited

U.S. PATENT DOCUMENTS

| | | | |
|---|---|---|---|
| 6,576,488 B2 | 6/2003 | Collins, III | |
| 6,642,652 B2 | 11/2003 | Collins, III | |
| 6,686,581 B2 | 2/2004 | Verhoeckx | |
| 6,864,110 B2 | 3/2005 | Summers | |
| 6,924,233 B1 * | 8/2005 | Chua et al. | 438/678 |
| 2003/0080341 A1 * | 5/2003 | Sakano et al. | 257/79 |
| 2007/0045761 A1 | 3/2007 | Basin | |
| 2007/0158668 A1 | 7/2007 | Tarsa | |
| 2009/0039365 A1 * | 2/2009 | Andrews et al. | 257/98 |

FOREIGN PATENT DOCUMENTS

| | | |
|---|---|---|
| JP | 2004048040 | 2/2004 |
| JP | 2006210491 | 8/2006 |
| JP | 2008066365 | 3/2008 |

OTHER PUBLICATIONS

European Search Report Issue for Patent Application No. 09004282.1 dated Sep. 27, 2012.

\* cited by examiner

*Primary Examiner* — Ha Tran T Nguyen
*Assistant Examiner* — Kevin Quinto
(74) *Attorney, Agent, or Firm* — H. C. Park & Associates, PLC

(57) ABSTRACT

A method of forming a phosphor coating layer on a light emitting diode (LED) chip using electrophoresis includes separating phosphor particles in a suspension according to a particle size, and coating the phosphor particles on a surface of the LED chip by sequentially depositing the separated phosphor particles on the surface of the LED chip according to the particle size. An apparatus to form a phosphor coating layer on an LED chip includes an electrophoresis bath to accommodate a suspension containing phosphor particles separated into layers according to a particle size, and electrodes disposed inside the electrophoresis bath. The electrodes may include a cathode electrode on which the LED chip may be arranged, and an anode electrode.

18 Claims, 8 Drawing Sheets

(a)

(b)

METHOD FOR COATING PHOSPHOR, APPARATUS TO PERFORM THE METHOD, AND LIGHT EMITTING DIODE COMPRISING PHOSPHOR COATING LAYER

CROSS REFERENCE TO RELATED APPLICATION

This application claims priority from and the benefit of Korean Patent Application No. 10-2008-0027731, filed on Mar. 26, 2008, which is hereby incorporated by reference for all purposes as if fully set forth herein.

BACKGROUND OF THE INVENTION

1. Field of the Invention

The present invention relates to light emitting diodes (LEDs) and to a technique for coating phosphors on an LED chip using electrophoresis.

2. Discussion of the Background

An LED packaging process may include forming a highly efficient optical system using LED chips, phosphors, and encapsulation members. In a typical LED package design, the encapsulation member of such an optical system may be formed using an encapsulation material such as epoxy resin or silicone gel.

However, the typical LED package design may include some optical incompatibilities. As a result, Fresnel reflection and total internal reflection loss may occur in the LED package due to a difference in refractive indices between the LED chips, the phosphors, and the encapsulation material.

The typical LED package design may also provide non-uniform light radiation from an LED. As a result, it may be more difficult to obtain a uniform radiation angle of light beams due to volumetric distribution of the phosphors in composites having different thicknesses. Further, white light may have a blue-shifted region (that is, light biased toward a blue color) and a yellow-shifted region (that is, light biased toward a yellow color).

The typical LED package design may also provide a local density variance, which may make it difficult to obtain a permanent optical coordinate.

The typical LED package design may cause the phosphors to be wasted. That is, the phosphors may be wasted due to the necessary use of volumetric composite coating.

FIG. 1 is a diagram showing a principle of electrophoresis for use in coating phosphors on an LED chip. Referring to FIG. 1, charged phosphors are deposited on an LED substrate that acts as part of a cathode electrode in relation to an anode electrode. In other words, electrophoresis enables the phosphors to be directly coated at high density to the LED substrate or an LED chip without using a conventional epoxy or silicone matrix and changing an effective refractive index of the phosphors. When a phosphor has a high refractive index, the phosphor also provides high optical output after being deposited. The electrophoresis approach may be useful for high output power white LEDs that use a large size LED (for example, 1×1 mm² or more).

Examples of a method of depositing phosphors by electrophoresis are disclosed in U.S. Pat. No. 6,576,488, U.S. Pat. No. 6,642,652, U.S. Pat. No. 6,686,581, and U.S. Patent Publication No. 2007/0045761 assigned to Lumlieds Lighting Co. Further, U.S. Pat. No. 6,864,110 and U.S. Pat. No. 6,924,233 assigned to Agilent Technology Inc., and JP 2006-21049 assigned to Nichia Kagaku Kogoy K. K. disclose a method of depositing charged phosphors on a conductive surface of an LED chip using electrophoresis to form a uniform phosphor layer that produces uniform white light without a colored ring phenomenon.

Fine phosphor particles may be used to prepare a homogeneous suspension for electrophoresis deposition. The phosphor particles generally have a size of 2 to 5 µm in the suspension. An apparatus for electrophoresis deposition includes an agitator that maintains a mixed state of the suspension in a bath. The suspension may be sufficiently mixed through agitation for 24 hours, for example.

When the phosphor layer is composed of the fine phosphor particles it may provide relatively inappropriate wavelength conversion efficiency to the phosphor particles. Reducing the size of the phosphor particles may lead not only to significant reduction in settlement of the phosphor particles, but also to reduction in wavelength conversion efficiency of the phosphors. Typically, when the size of silicate phosphors is reduced by half, from 20 µm down to 10 µm, the wavelength conversion efficiency may be reduced by about 10 to 20%. Generally, phosphor particles having a diameter of 15 µm maintain higher radiation efficiency.

Accordingly, large-size phosphor particles may be advantageously used to increase phosphor coating efficiency on one hand, but on the other hand may form an incomplete phosphor coating layer due to a low density of the large-size phosphor particles once deposited. One solution is to increase the thickness of the phosphor coating layer to increase the density of phosphors. But increasing the thickness of the phosphor coating layer may cause excessive consumption of phosphors, high internal absorption, and scattering of light by large-size phosphor particles, and the like.

SUMMARY OF THE INVENTION

The present disclosure provides a method of forming a phosphor coating layer on a light emitting diode (LED) chip using electrophoresis, an apparatus to perform the method, and an LED including a phosphor coating layer formed on a surface of an LED chip by electrophoresis.

Additional features of the invention will be set forth in the description which follows, and in part will be apparent from the description, or may be learned by practice of the invention.

The present invention discloses a method of forming a phosphor coating layer on a light emitting diode (LED) chip using electrophoresis, the method including: separating phosphor particles in a suspension according to a particle size; and coating the phosphor particles on a surface of the LED chip by sequentially depositing the separated phosphor particles on a surface of the LED chip according to the particle size.

The present invention also discloses a phosphor coating apparatus including: an electrophoresis bath comprising a suspension containing phosphor particles separated into a plurality of layers according to a particle size; a cathode electrode disposed inside the electrophoresis bath and located in one of the plurality of layers in the suspension; an anode electrode disposed inside the electrophoresis bath to face the cathode electrode; and an electrode elevator to move the cathode electrode from a first layer to a second layer.

The present invention also discloses a phosphor coating apparatus including: a settlement bath comprising a suspension containing phosphor particles separated into a plurality of layers according to a particle size; an electrophoresis bath including a cathode electrode and an anode electrode facing the cathode electrode; and a first pump and a first valve to select a first layer and to supply the suspension of the first layer to the electrophoresis bath.

The present invention also discloses a light emitting diode (LED) including a phosphor coating layer formed on a surface of an LED chip by electrophoresis, wherein the phosphor coating layer includes first phosphor particles primarily arranged on the surface of the LED chip and second phosphor particles having a smaller size than a size of the first phosphor particles and arranged on the surface of the LED chip to fill gaps between the first phosphor particles.

The present invention also discloses a light emitting diode (LED) including a phosphor coating layer formed on a surface of an LED chip by electrophoresis, wherein the phosphor coating layer includes preliminary phosphor particles deposited on the surface of the LED chip, first phosphor particles having a larger size than the preliminary phosphor particles and arranged on the surface of the LED chip after the preliminary phosphor particles, and second phosphor particles having a smaller size than a size of the first phosphor particles and arranged on the surface of the LED chip to fill gaps between the first phosphor particles.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
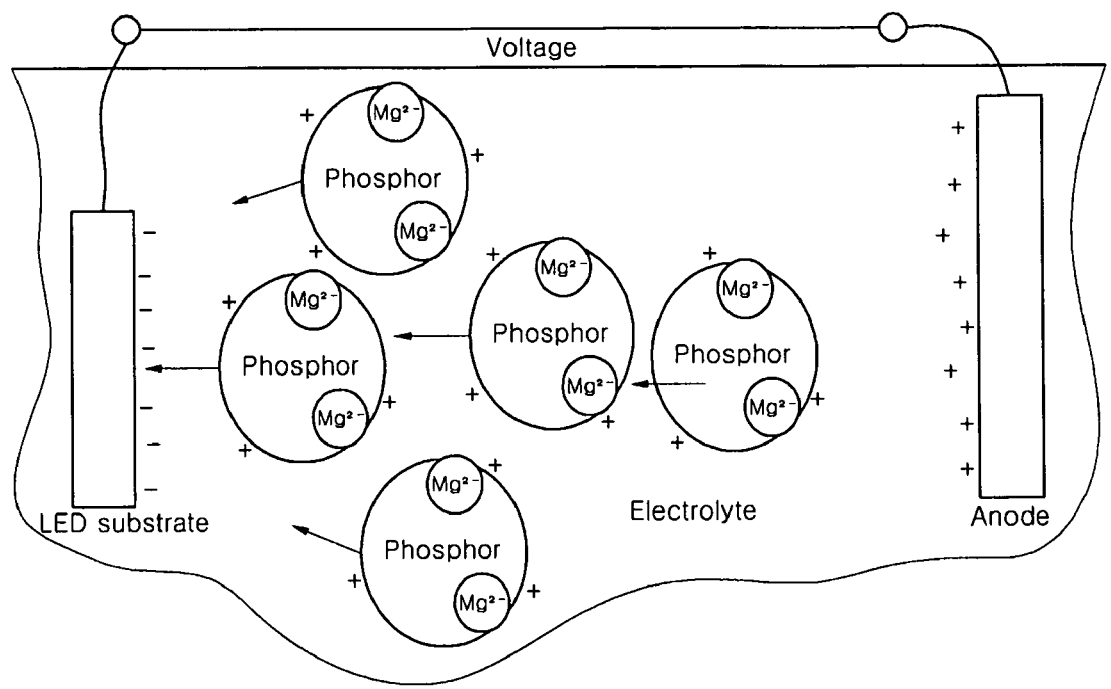
FIG. 1 is a diagram showing a principle of electrophoresis for use in coating phosphors on an LED chip.

The invention is described more fully hereinafter with reference to the accompanying drawings, in which exemplary embodiments of the invention are shown. This invention may, however, be embodied in many different forms and should not be construed as limited to these exemplary embodiments. Rather, these exemplary embodiments are provided so that this disclosure is thorough, and fully conveys the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Exemplary embodiments of the present invention will be described in detail below with reference to the accompanying drawings.

Figure 2:
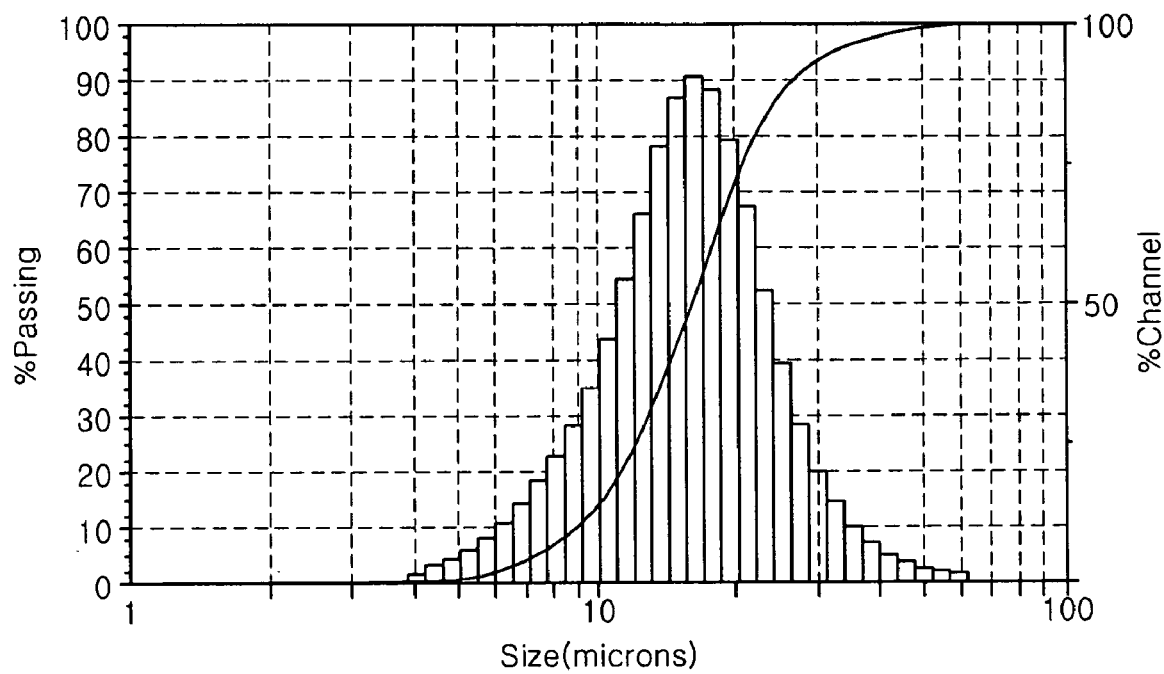
FIG. 2 is a graph depicting a distribution of phosphor particles for use in electrophoresis deposition of phosphors according to an exemplary embodiment of the present invention.

FIG. 2 is a graph depicting a distribution of phosphor particles for use in electrophoresis deposition of phosphors according an exemplary embodiment of the present invention. To achieve a more efficient deposition of phosphors on an LED chip, a mixture of phosphors having a wide size distribution as shown in FIG. 2 may be used.

The phosphor mixture may include small-size phosphor particles (1 to 5 μm) and large-size phosphor particles (10 μm or more). As described above, the greater the phosphor particle size, the higher the obtained radiation efficiency (or luminance efficiency).

Figure 3:
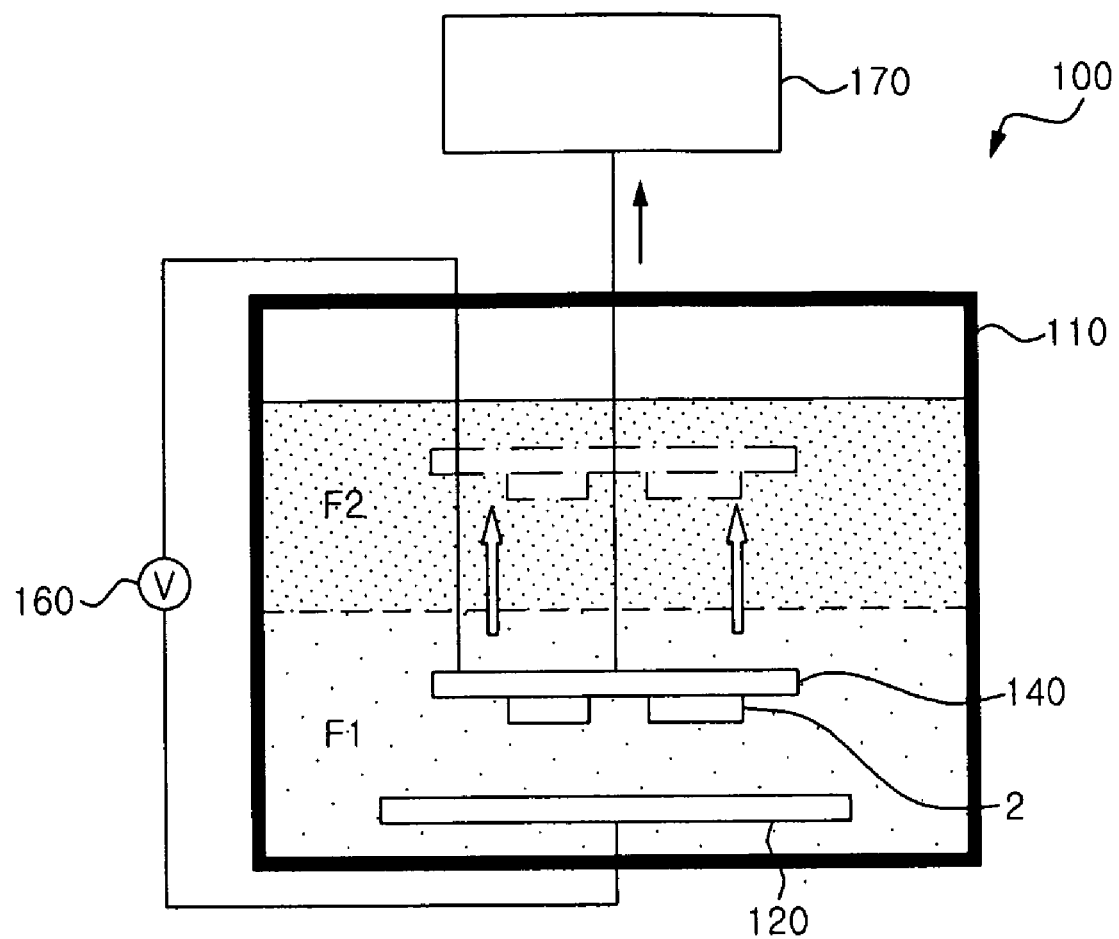
FIG. 3 is a view of a phosphor coating apparatus according to an exemplary embodiment of the present invention.

First, as a powdery mixture having a wide particle size distribution, the phosphor mixture is sufficiently mixed with an electrolyte suspension by agitation. When the mixed suspension is preserved inside an electrophoresis bath for a predetermined duration without contact with an external environment, the phosphor particles settle. The settlement of the phosphor particles causes a depthwise distribution of the phosphor particles inside the electrophoresis bath. In other words, the large-size phosphor particles will settle at a lower location in the suspension and the small-size phosphor particles will settle at a higher location in the suspension. Accordingly, many particle layers may be formed inside the electrophoresis bath. As a simple configuration, the suspension may be divided into two layers as shown in FIG. 3. Hereinafter, a method for coating phosphors and apparatus to perform the method will be described with reference to FIG. 3.

In FIG. 3, a phosphor coating apparatus 100 includes an electrophoresis bath 110, and an anode electrode 120 and a cathode electrode 140 disposed in the electrophoresis bath 110. The anode electrode 120 and the cathode electrodes 140 are each connected to an external power source 160. The anode electrode 120 is located at a lower height inside the electrophoresis bath 110, that is, is located closer to the bottom of the electrophoresis bath 110, and the cathode electrode 140 is located above and facing the anode electrode 120. Further, an LED chip 2 is positioned on the cathode electrode 140 in a bare chip state or in a state of being mounted on a substrate, which is part of an LED package.

Inside the electrophoresis bath 110, the suspension is separated into a first layer F1, which is located at a lower region of the electrophoresis bath 110 and is mainly composed of phosphor particles having a greater average size than the particles in the rest of the electrophoresis bath, and a second layer F2, which is located at an upper region of the electrophoresis bath 110 and is mainly composed of phosphor particles having a smaller average size than the particles in the rest of the electrophoresis bath 110. The criteria of this separation is not strictly determined but rather can be determined by a user. Inside the electrophoresis bath 110, the separation of the phosphor particles into the large-size phosphor particles and the small-size particles may be obtained by gravity or centrifugal separation process.

First, to deposit the large-size phosphor particles on the surface of the LED chip 2, the cathode electrode 140 having the LED chip 2 is located in the first layer F1 that is mainly composed of the large-size phosphor particles. Here, it should be noted that the anode electrode 120 can be also located in the first layer F1 below the cathode electrode 140. In this state, when voltage is applied from the power source 160 to the electrodes, the large-size phosphor particles are charged and move toward the cathode electrode 140, and the particles are then deposited in a rough arrangement on the surface of the LED chip 2.

Then, to deposit the small-size phosphor particles, the cathode electrode 140 is shifted to the second layer F2 that is mainly composed of the small-size phosphor particles. In the present exemplary embodiment, the upward or downward movement of the cathode electrode 140 may be performed using an electrode elevator 170 that is operated by electric power, hydraulic pressure, or air pressure. Alternatively, the movement of the cathode electrode 140 may be manually achieved without the electrode elevator 170. When voltage is applied from the power source 160 to the electrodes after moving the cathode electrode 140 and the LED chip 2 to the second layer F2, the small-size phosphor particles are deposited on the surface of the LED chip 2. The small-size phosphor particles fill gaps between the previously deposited large-size phosphor particles, that is, holes in an initial phosphor coating layer, thereby improving density of the phosphor coating layer.

Figure 4:
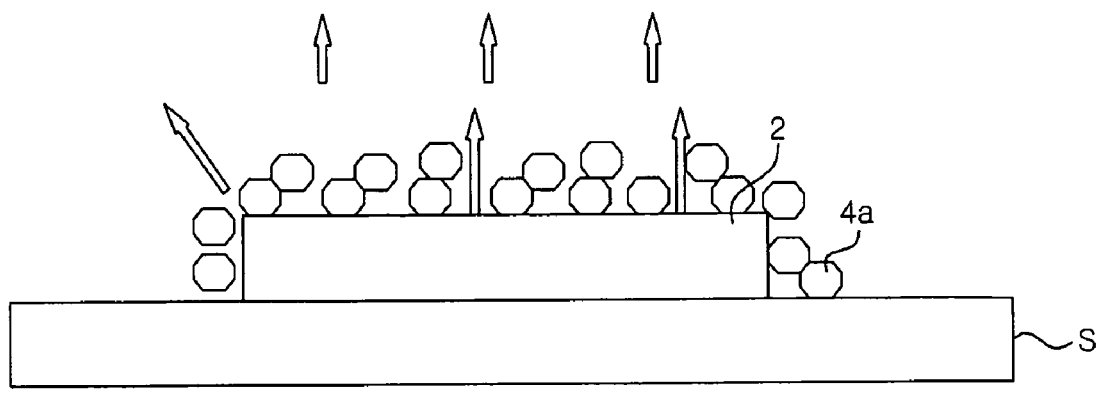
FIG. 4(a) and FIG. 4(b) are views of a method for coating phosphors according to an exemplary embodiment of the present invention.
Figure 4:
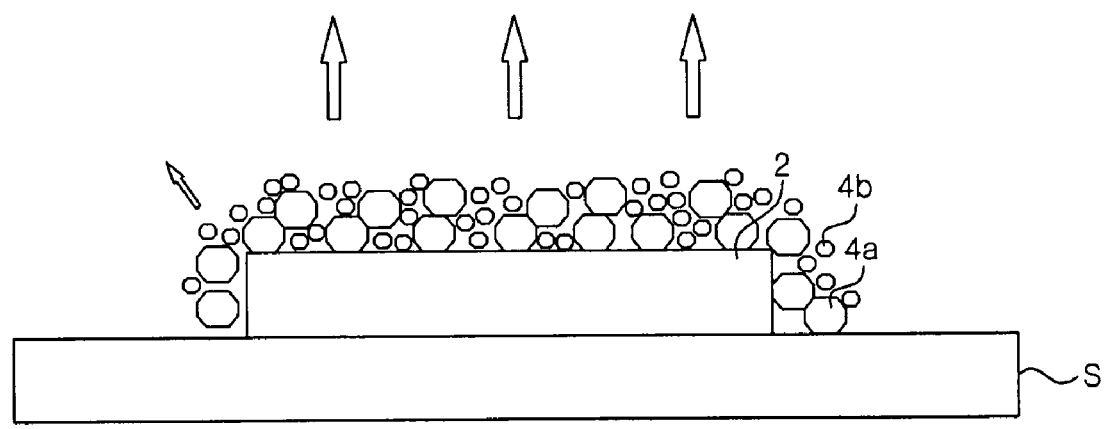

In FIG. 4(*a*) and FIG. 4(*b*) show respective steps of the electrophoresis phosphor coating method performed using, for example, the apparatus as shown in FIG. 3.

As formed in the first step of coating large-size phosphor particles shown in FIG. 4(*a*), an initial phosphor coating layer may have a low quality. The phosphor coating layer shown in FIG. 4(*a*) has a number of gaps between large-size phosphor particles 4*a*, through which a significant amount of blue light may pass without being subjected to wavelength conversion into yellow or other colored light. In a white LED including a blue LED chip having the initial phosphor coating layer alone, the white LED may emit white light exhibiting severe blue shift due to a large amount of blue color that does not undergo wavelength conversion. In the second step, shown in FIG. 4(*b*), holes of the previously deposited large-size phosphor particles 4*a* (that is, the gaps between the large-size phosphor particles) are filled with small-size phosphor particles 4*b*, thereby further improving the quality of the phosphor coating layer and a color coordinate. Thus, the phosphor coating layer for wavelength conversion may be formed with high efficiency and quality using the first and second steps of the method. In FIG. 4(*a*) and FIG. 4(*b*), reference character S indicates the substrate on which the LED chip 2 is mounted, and the substrate may be part of a general LED package.

An exemplary suspension solution may contain water and isopropyl alcohol as a solvent, La(NO$_3$)$_2$, Al(NO$_3$)$_2$, or other salts as an electrolyte, and a doped yttrium aluminum garnet (YAG) compound (or, for example, other types of phosphors such as thiogallate, silicate, and the like) as phosphor particles.

The electrophoresis method according to an exemplary embodiment of the present invention enables easier control of the phosphor coating layer formation, along with a coating rate and time, thereby ensuring that the phosphor coating layer has a more uniform thickness. In some embodiments of the present invention, the phosphor coating layer may have a thickness of about 20 to 100 μm.

Although not shown in the drawings, an electrically conductive layer may be coated on the surface of the LED chip 2 to provide electrical conductivity to the surface of the LED chip 2, and the phosphor coating layer is actually deposited on the electrically conductive layer by electrophoresis. The electrical conductivity of the conductive layer is selected to allow the conductive layer to be used as part of the electrodes during electrophoresis without causing short circuit during normal operation of the LED. The conductive layer may be a transparent oxide layer, and more specifically, one oxide selected from the group consisting of indium-tin-oxide (ITO) and antimony-tin-oxide (ATO). In one exemplary embodiment, the conductive layer is composed of ATO and has a thickness of about 52 nm. The conductive layer may be formed by wetting the surface of the LED chip with an ATO solution, and then drying the surface of the LED chip. Alternatively, a transparent Al-thin film may be formed on the surface of the LED chip by Al-deposition. In this case, the transparent Al-thin film is subjected to oxidation into a transparent insulator after electrophoresis. After being used to protect other regions on the substrate provided as a coating target during electrolysis, an insulation coating (or mask) may be removed through, for example, typical wet stripping with acetone, mechanical stripping, or dry stripping (for example, oxygen plasma stripping). A distance (for example, in the range of 3 to 10 cm) between the anode electrode and the LED chip can be changed according to distribution of phosphors in the solution and a supply voltage of about 40 to 500V. This voltage can also be changed according to the distance between the electrodes.

Figure 5:
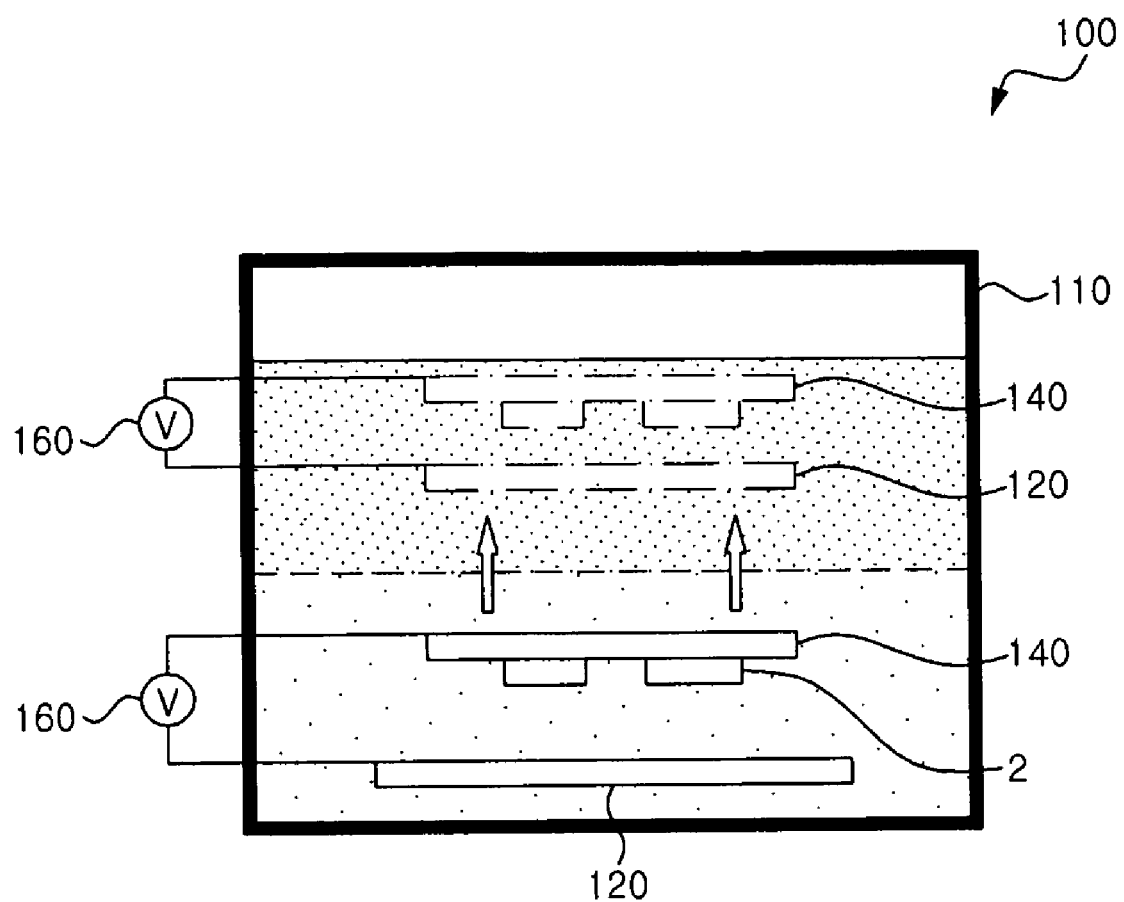
FIG. 5 is a view showing a phosphor coating apparatus according to an exemplary embodiment of the present invention.

In the configuration shown in FIG. 3, the distance between the cathode electrode 140 and the anode electrode 120 is changed by moving the cathode electrode 140 having the LED chip 2 inside the electrophoresis bath 110 without moving the anode electrode 120. However, as shown in FIG. 5, the anode electrode 120 and the cathode electrode 140 may both be moved within the electrophoresis bath 110.

According to an exemplary embodiment of the present invention, various multilayer phosphor systems may be formed on the LED chip. For example, after deposition of preliminary small-size phosphor particles on an LED chip, large-size phosphor particles and small-size phosphor particles may be sequentially deposited thereon. Further, a multilayer phosphor system may be formed on the LED chip using different kinds of phosphors, which have different sizes and properties.

In the exemplary embodiments described above, as shown in FIG. 3 and FIG. 4, the method includes only two steps of depositing the large-size phosphor particles and the small-size phosphor particles in relation to phosphor deposition by electrophoresis.

Next, methods for phosphor deposition by electrophoresis according to other exemplary embodiments will be described.

As briefly described above, a phosphor particle settlement or sedimentation process is performed to separate the large-size phosphor particles and the small-size phosphor particles. In particular, a settlement process based on gravity or centrifugal separation process may be used.

Figure 6:
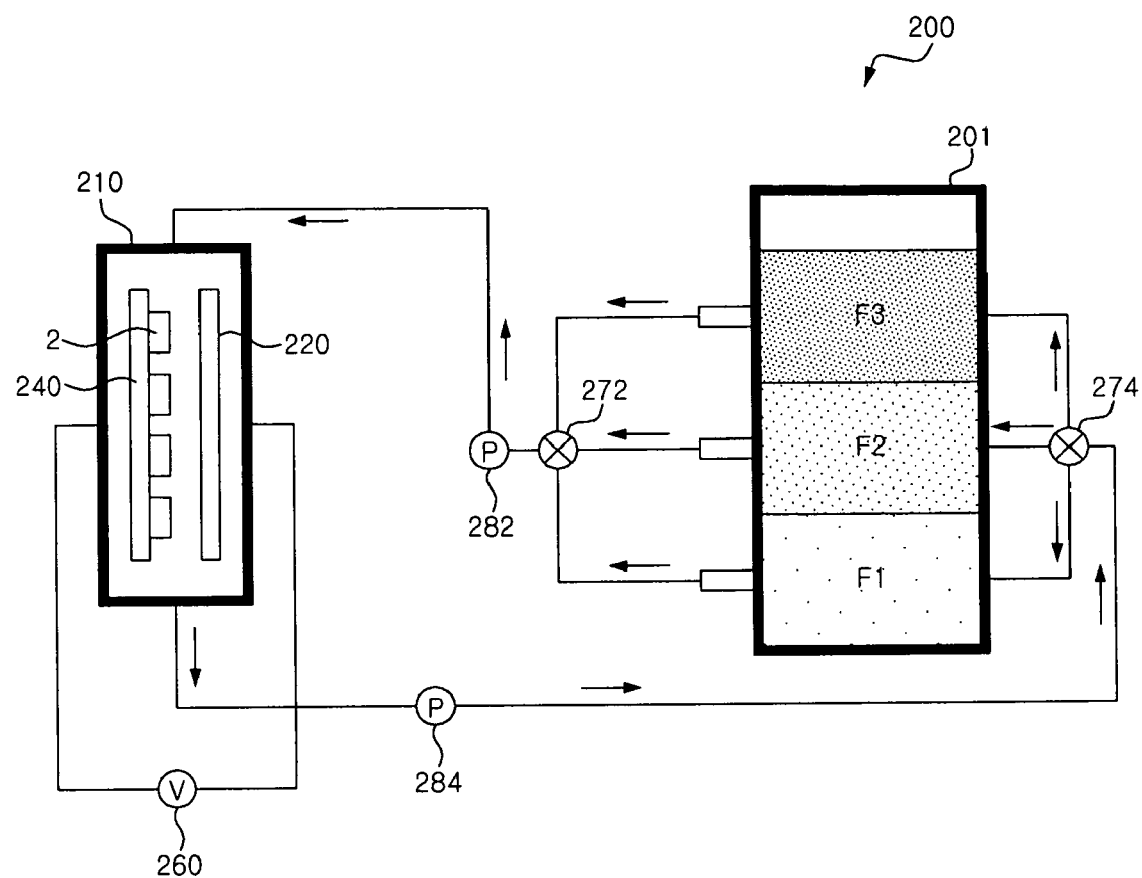
FIG. 6 is a view of a phosphor coating apparatus according to an exemplary embodiment of the present invention.

FIG. 6 shows a phosphor coating apparatus according to an exemplary embodiment of the present invention and a coating method using the same.

Referring to FIG. 6, a phosphor coating apparatus 200 includes a settlement bath 201, an electrophoresis bath 210, anode electrode 220 and cathode electrode 240 disposed inside the electrophoresis bath 210, and a power source 260 for applying voltage to the anode electrode 220 and the cathode electrode 240.

Inside the settlement bath 201, a phosphor suspension is separated by centrifugal or gravity separation into many layers (or fractions) according to an average size of the phosphor particles. In the present exemplary embodiment, the phosphor suspension is separated into a first layer F1, a second layer F2, and a third layer F3.

the phosphor coating apparatus 200 further includes three pipe lines connected to the settlement bath 201 and respectively corresponding to the first layer F1, the second layer F2, and the third layer F3, and a first valve 272 connected to distal ends of the pipe lines. The first valve 272 allows selection of the suspension of the first layer F1, second layer F2, or the third layer F3, as supplied from the three pipe lines, and supply of the selected suspension to the electrophoresis bath 210 through a single pipe line. Accordingly, the first valve 272 permits supply of large-size phosphor particles in the first layer F1, middle-size phosphor particles in the second layer F2, or small-size phosphor particles in the third layer F3 to the electrophoresis bath 210.

The phosphor coating apparatus 200 may further include a second valve 274 which receives the suspension containing the phosphor particles remaining after phosphor coating from the electrophoresis bath 210 through a single pipe line, and which selectively supplies the received suspension to the first layer F1, the second layer F2, or the third layer F3 in the settlement bath 201. Further, the coating apparatus 200 may include a first pump 282 which provides a supply flow of the suspension from the settlement bath 201 to the electrophoresis bath 210 via the first valve 272, and a second pump 284 which provides a recovery flow of the suspension from the electrophoresis bath 210 to the settlement bath 201 via the second valve 274. The first pump 282 and the second pump 284 enable a suspension flow of an optimal speed between the settlement bath 201 and the electrophoresis bath 210.

The anode electrode 220 and the cathode electrode 240 are located inside the electrophoresis bath 210. When voltage is applied from the power source 260 to the anode electrode 220 and the cathode electrode 240, a phosphor coating layer is formed on the surface of the LED chip 2 arranged on the cathode electrode 240 by electrophoresis. The phosphor coating layer(s) may be formed differently by adjusting factors, for example the size of phosphor particles, voltage, distance between the electrodes, and the like. In FIG. 6, the electrophoresis bath 210 is shown as having a vertical configuration and the anode electrode 220 and the cathode electrode 240 are shown as vertically disposed in the electrophoresis bath 210 to face each other. However, the electrophoresis bath 210 may have a horizontal configuration with the anode electrodes 220 and the cathode electrode 240 suitably disposed.

Next, a method of forming a phosphor coating layer on an LED chip by electrophoresis using the phosphor coating apparatus 200 will be described.

First, a suspension is separated into a first layer F1, a second layer F2, and a third layer F3 inside the settlement bath 201. The separation may be achieved by gravity or centrifugal separation process. Then, the suspension containing large-size phosphor particles is supplied from the first layer F1 to the electrophoresis bath 210 by operating the first pump 282 while opening a pipe line between the first layer F1 in the settlement bath 201 and the electrophoresis bath 210 by the first valve 272.

Then, voltage is applied from the power source 260 to the anode electrode 220 and the cathode electrode 240. As a result, the large-size phosphor particles in the suspension are deposited on the surface of the LED chip 2 mounted on the cathode electrode 240 by electrophoresis. After depositing the large-size phosphor particles in a desired amount, the suspension remaining inside the electrophoresis bath 210 is recovered back to the first layer F1 in the settlement bath 201 by operating the second pump 284 while opening a pipe line between the electrophoresis bath 210 and the first layer F1 in the settlement bath 201 by the second valve 274.

Then, the suspension containing middle-size phosphor particles is supplied from the second layer F2 to the electrophoresis bath 210 by operating the first pump 282 while opening another pipe line between the second layer F2 in the settlement bath 201 and the electrophoresis bath 210 by the first valve 272.

Then, voltage is applied from the power source 260 to the anode electrode 220 and the cathode electrode 240. As a result, the middle-size phosphor particles in the suspension are deposited on the surface of the LED chip 2 mounted on the cathode electrode 240 by electrophoresis. After depositing the middle-size phosphor particles in a desired amount, the suspension remaining inside the electrophoresis bath 210 is recovered back to the second layer F2 in the settlement bath 201 by operating the second pump 284 while opening another pipe line between the electrophoresis bath 210 and the second layer F2 in the settlement bath 201 by the second valve 274.

Then, the suspension containing small-size phosphor particles is supplied from the third layer F3 to the electrophoresis bath 210 by operating the first pump 282 while opening a third pipe line between the third layer F3 in the settlement bath 201 and the electrophoresis bath 210 by the first valve 272.

Next, voltage is applied from the power source 260 to the anode electrode 220 and the cathode electrode 240. As a result, the small-size phosphor particles in the suspension are deposited on the surface of the LED chip 2 mounted on the cathode electrode 240 by electrophoresis. After depositing the small-size phosphor particles in a desired amount, the suspension remaining inside the electrophoresis bath 210 is recovered back to the third layer F3 in the settlement bath 201 by operating the second pump 284 while opening a third pipe line between the electrophoresis bath 210 and the third layer F3 in the settlement bath 201 by the second valve 274.

As described above, the phosphor particles may be deposited on the surface of the LED chip 2 in order of decreasing size, that is, from the large-size phosphor particles to the small-size phosphor particles. However, the phosphor particles may be deposited thereon in different orders.

Figure 7:
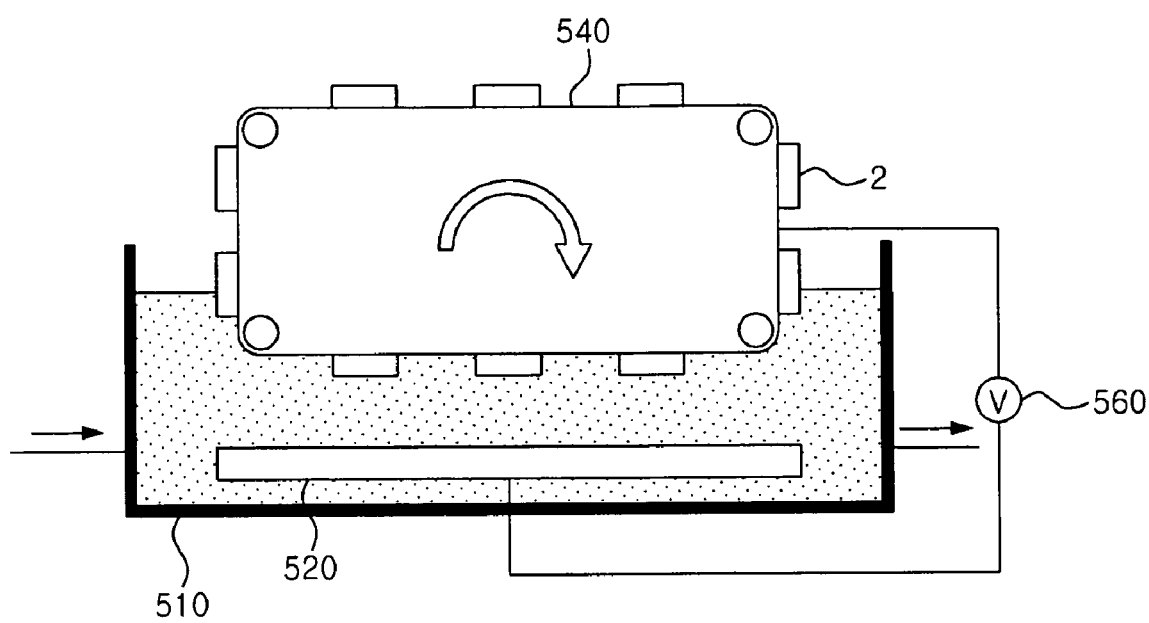
FIG. 7 is a view of a phosphor coating apparatus according to an exemplary embodiment of the present invention.

FIG. 7 shows a phosphor coating apparatus according to an exemplary embodiment of the present invention. In the present exemplary embodiment, the apparatus may include a settlement bath, first and second valves, first and second pumps, and pipe lines as the exemplary embodiment shown in FIG. 6 and described above. Therefore, these components are omitted from FIG. 7.

The apparatus of the present exemplary embodiment is configured to enable a more continuous supply of LED chips 2 into an electrophoresis bath 510 for electrophoretic deposition in mass production, and employs an endless belt-type cathode electrode 540 which passes through the electrophoresis bath 510 while continuously circulating. The anode electrode 520 is arranged in the electrophoresis bath 510. Here, factors such as voltage, a rotating speed of the belt-type cathode electrode 540, a distance between an anode electrode 520 and the cathode electrode 540, a size of phosphor particles, and the like, can be adjusted to obtain a desired phosphor coating layer on the surfaces of the LED chips 2. A power source 560 is connected to the belt-type cathode electrode 540 and the anode electrode 520. Supply of the suspension to the electrophoresis bath 510 occurs through a single pipe line, and the suspension remaining after phosphor coating is removed from the electrophoresis bath 510 through a single pipe line.

Figure 8:
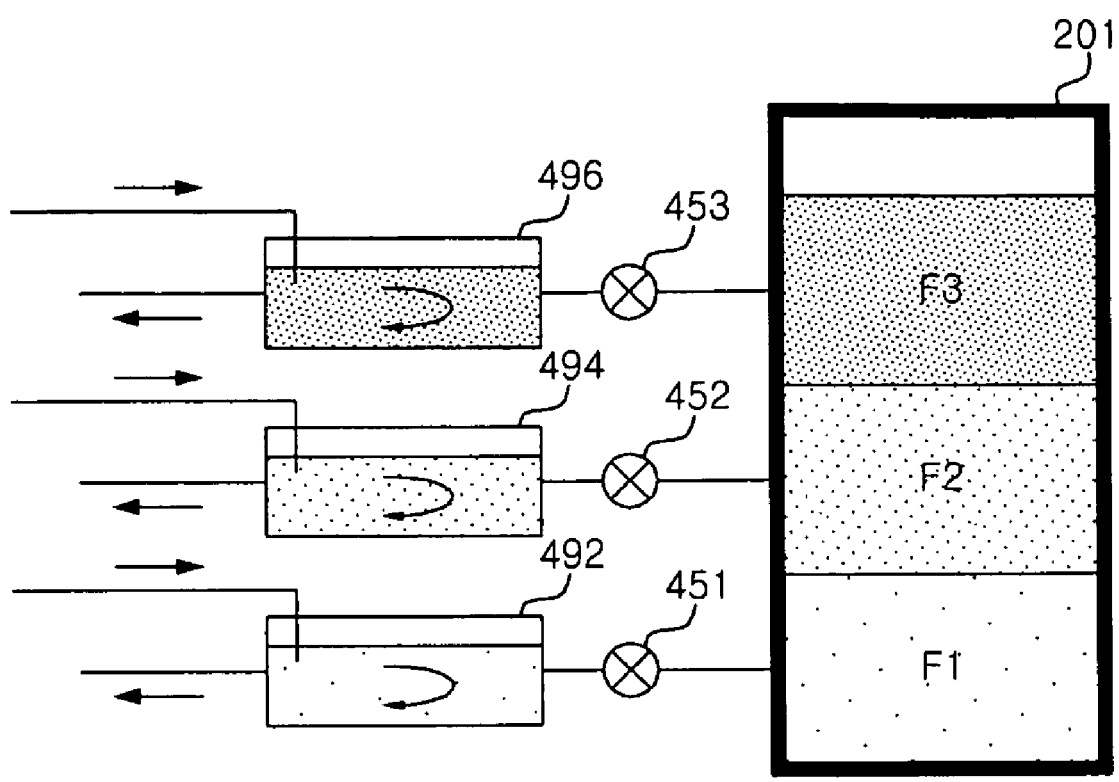
FIG. 8 is a view of a phosphor coating apparatus according to an exemplary embodiment of the present invention.

FIG. 8 shows a phosphor coating apparatus according to an exemplary embodiment of the present invention. Referring to FIG. 8, a settlement bath 201 is used along with separation baths 492, 494, and 496 corresponding to various sizes of phosphor particles and layers of the settlement bath 201. The separation baths 492, 494, and 496 are respectively connected to a first layer F1, a second layer F2, and a third layer F3 in the settlement bath 201 via individual pipe lines, which respectively include on/off valves 451, 452, and 453. As described above, the large-size phosphor particles are located in the first layer F1, the middle-size phosphor particles are located in the second layer F2, and the small-size phosphor particles are located in the third layer F3.

With the separation baths 492, 494 and 496, the phosphor coating apparatus may provide various functions, such as agitation, phosphor filtering, nitrogen gas drying, liquid cleaning, and the like, which can be added to a system for electrophoretic deposition of phosphors. These functions are disclosed in U.S. Patent Publication No. 2007/158668.

As apparent from the above description, according to an exemplary embodiment of the present invention, larger phosphor particles can be used to increase phosphor coating efficiency and smaller phosphor particles can be used to fill gaps between the larger phosphor particles, thereby increasing phosphors density and providing an LED having a higher quality phosphor coating layer formed on the surface of an LED chip.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming a phosphor coating layer on a light emitting diode (LED) chip using electrophoresis, the method comprising:
    separating phosphor particles in a suspension according to a particle size; and
    coating the phosphor particles on a surface of the LED chip by sequentially depositing the separated phosphor particles on a surface of the LED chip according to the particle size,
    wherein the phosphor particles are separated by a centrifugal separation process or a gravity separation process.

2. The method according to claim 1, wherein separating phosphor particles comprises separating phosphor particles comprising a larger particle size in the suspension closer to the bottom of a bath containing the suspension.

3. The method according to claim 2, wherein the phosphor particles are separated and coated inside an electrophoresis bath, in which a cathode electrode and an anode electrode are arranged, the LED chip being disposed on the cathode electrode.

4. The method according to claim 2, wherein the phosphor particles are coated inside an electrophoresis bath, in which a cathode electrode and an anode electrode are arranged, the LED chip being disposed on the cathode electrode, and wherein separating the phosphor particles comprises separating the phosphor particles into a plurality of layers inside a settlement bath, the phosphor particles being sequentially supplied from the respective layers to the electrophoresis bath during the coating step.

5. The method according to claim 1, wherein coating the phosphor particles comprises depositing large-size phosphor particles on the surface of the LED chip and then depositing a first portion of small-size phosphor particles on the surface of the LED chip.

6. The method according to claim 5, wherein coating the phosphor particles comprises depositing middle-size phosphor particles on the surface of the LED chip between depositing the large-size phosphor particles on the surface of the LED chip and the small-size phosphor particles on the surface of the LED chip.

7. The method according to claim 5, further comprising:
    depositing a second portion of small-size phosphor particles on the surface of the LED chip before depositing the large-size phosphor particles on the surface of the LED chip.

8. The method according to claim 3, wherein separating the phosphor particles comprises separating the phosphor particles in the suspension into a plurality of layers inside the electrophoresis bath according to the particle size, and wherein coating the phosphor particles further comprises moving the cathode electrode from a first layer to a second layer.

9. The method according to claim 4, wherein the cathode electrode is a belt-type cathode electrode, at least a portion of which is arranged in the electrophoresis bath, the method further comprising:
    supplying a plurality of LED chips to the electrophoresis bath using the belt-type cathode electrode.

10. A phosphor coating apparatus, comprising:
    an electrophoresis bath comprising a suspension containing phosphor particles separated into a plurality of layers according to a particle size;
    a cathode electrode disposed inside the electrophoresis bath and located in one of the plurality of layers in the suspension;
    an anode electrode disposed inside the electrophoresis bath; and
    an electrode elevator to move the cathode electrode from a first layer to a second layer.

11. The phosphor coating apparatus according to claim 10, wherein the phosphor particles are separated by a gravity separation process or a centrifugal separation process.

12. The phosphor coating apparatus according to claim 10, further comprising a light emitting diode (LED) chip arranged on the cathode electrode.

13. A phosphor coating apparatus, comprising:
    a settlement bath comprising a suspension containing phosphor particles separated into a plurality of layers according to a particle size;
    an electrophoresis bath comprising an anode electrode and a cathode electrode; and
    a first pump and a first valve to select a first layer and to supply the suspension of the first layer to the electrophoresis bath.

14. The phosphor coating apparatus according to claim 13, wherein the phosphor particles are separated by a gravity separation process or a centrifugal separation process.

15. The phosphor coating apparatus according to claim 13, further comprising a light emitting diode (LED) chip arranged on the cathode electrode.

16. The phosphor coating apparatus according to claim 13, further comprising:
    a second pump and a second valve to select the first layer and to recover the suspension remaining in the electrophoresis bath to the first layer.

17. The phosphor coating apparatus according to claim 13, wherein the cathode electrode is a belt-type cathode electrode, at least a portion of which arranged in the electrophoresis bath.

18. The phosphor coating apparatus according to claim 11, further comprising:
    a plurality of separation baths connected to the settlement bath, the plurality of separation baths corresponding to the plurality of layers, respectively.

* * * * *